United States Patent
Ahn

(10) Patent No.: US 10,624,222 B2
(45) Date of Patent: Apr. 14, 2020

(54) NETWORK PORT COVER MODULE AND NETWORK PORT LOCKING DEVICE HAVING SAME

(71) Applicant: COMXI Co., Ltd., Seoul (KR)

(72) Inventor: Chang Hoon Ahn, Gyeonggi-do (KR)

(73) Assignee: COMXI CO., LTD., Seoul (KR)

( * ) Notice: Subject to any disclaimer, the term of this patent is extended or adjusted under 35 U.S.C. 154(b) by 0 days.

(21) Appl. No.: 16/260,474

(22) Filed: Jan. 29, 2019

(65) Prior Publication Data

US 2020/0015374 A1   Jan. 9, 2020

(30) Foreign Application Priority Data

Jul. 5, 2018   (KR) .......................... 10-2018-0078314

(51) Int. Cl.
*H05K 5/02*   (2006.01)
*H05K 5/03*   (2006.01)

(52) U.S. Cl.
CPC ......... *H05K 5/0208* (2013.01); *H05K 5/0221* (2013.01); *H05K 5/0247* (2013.01); *H05K 5/03* (2013.01)

(58) Field of Classification Search
CPC .. H01R 13/443; H05K 5/0208; H05K 5/0221; H05K 5/0247; H05K 5/03
USPC ........................................ 439/135, 133, 148
See application file for complete search history.

(56) References Cited

U.S. PATENT DOCUMENTS

| | | | | |
|---|---|---|---|---|
| 5,527,186 A * | 6/1996 | Ito | .......................... | B60R 21/017 439/148 |
| 5,637,002 A * | 6/1997 | Buck | .................... | H01R 13/443 439/148 |
| 7,128,586 B2 * | 10/2006 | Kung | .................. | H01R 13/6275 439/133 |
| 7,462,045 B1 * | 12/2008 | Lee | ....................... | H01R 13/443 439/133 |
| 7,465,181 B1 * | 12/2008 | Bridges | .............. | H01R 13/6271 439/133 |
| 7,479,021 B2 * | 1/2009 | Huang | .................. | H01R 13/629 439/133 |
| 7,913,527 B2 * | 3/2011 | Chen | ........................ | E05B 37/02 439/133 |
| 8,425,249 B2 * | 4/2013 | Hackett | ................ | H01R 13/443 439/357 |
| 9,710,677 B1 * | 7/2017 | Mosholder | .............. | G06F 21/86 |

(Continued)

FOREIGN PATENT DOCUMENTS

EP   1699114 A1   9/2006
JP   11-154566 A   6/1999

(Continued)

*Primary Examiner* — Gary F Paumen
(74) *Attorney, Agent, or Firm* — Nelson Mullins Riley & Scarborough LLP; Kongsik Kim, Esq.

(57) ABSTRACT

Disclosed is a network port cover module and a network port locking device having the cover module. The network port cover module includes a plurality of modules inserted into and coupled to a network port of a network device, the plurality of modules being configured to be locked and coupled together or separated from each other, and configured to be locked and coupled to or unlocked and separated from the network port according to a locked and coupled state or an unlocked and separated state of the plurality of modules.

10 Claims, 15 Drawing Sheets

(56) References Cited

U.S. PATENT DOCUMENTS

| | | | |
|---|---|---|---|
| 2005/0202698 A1* | 9/2005 | Miao | G06F 21/85 |
| | | | 439/133 |
| 2006/0040564 A1 | 2/2006 | Morrison et al. | |
| 2006/0234533 A1* | 10/2006 | Lei | H01R 13/44 |
| | | | 439/135 |
| 2009/0263993 A1* | 10/2009 | Bolain | H01R 13/6397 |
| | | | 439/133 |
| 2010/0151712 A1* | 6/2010 | Chang | H01R 13/447 |
| | | | 439/135 |
| 2010/0184313 A1* | 7/2010 | Morrison | H01R 13/5213 |
| | | | 439/133 |
| 2011/0008981 A1* | 1/2011 | McSweeney | H01R 13/44 |
| | | | 439/135 |
| 2011/0300727 A1* | 12/2011 | Liang | H01R 13/639 |
| | | | 439/133 |
| 2012/0289069 A1* | 11/2012 | Chueh | H01R 13/443 |
| | | | 439/135 |
| 2015/0024616 A1* | 1/2015 | Choi | H01R 13/64 |
| | | | 439/135 |

FOREIGN PATENT DOCUMENTS

| | | |
|---|---|---|
| JP | 2005-158664 A | 6/2005 |
| KR | 101768190 B1 | 8/2017 |

* cited by examiner

NETWORK PORT COVER MODULE AND NETWORK PORT LOCKING DEVICE HAVING SAME

CROSS REFERENCE TO RELATED APPLICATION

The present application claims priority to Korean Patent Application No. 10-2018-0078314, filed Jul. 5, 2018, the entire contents of which is incorporated herein for all purposes by this reference.

BACKGROUND OF THE INVENTION

Field of the Invention

The present invention relates to a network port locking device for locking a network port connecting a local area network (LAN) cable for data transmission.

Description of the Related Art

Recently, criminal acts that an outsider or non-administrator brakes into a financial institution or a government-affiliated organization and takes out a data stored in a computer are occurred, and causing a big stir in a society. Various countermeasures are proposed to cope with the criminal acts.

Considering this point, recently, various technologies have been proposed to physically block a universal serial bus (USB) port of a computer and prevent connection of an unauthorized USB port or cable to the USB port.

Also, by physically blocking a LAN port to which a LAN cable is connected, that is, a network port, various technologies are proposed to prevent a loss of data through the network port.

In the case of conventional network port locking devices, most of them are configured as devices that prevent a LAN cable connected to a network port from being disconnected, and thus prevent connection of an unauthorized LAN cable through the network port.

However, in the case of conventional network ports, a plurality of network ports is provided in an electronic device or a hub device, and most network ports other than a port used by connecting a LAN cable thereto are exposed in open states, so the open ports need to be protected by being blocked.

Therefore, a device for blocking and protecting a network port with ensuring security is demanded.

DOCUMENTS OF RELATED ART (Patent Document 1) Korean Patent No. 10-0562715 (COMPUTER ANTI THIEF METHOD AND SYSTEM WITH INTERNETCONNECTION)
(Patent Document 2) Korean Patent No. 10-1323364 (AN APPARATUS FOR LOCKING USB PORT)

SUMMARY OF THE INVENTION

Accordingly, the present invention has been made keeping in mind the above problems occurring in the related art, and the present invention is intended to propose a network cover module that can lock a network port of an electronic device, and a network port locking device having the cover module.

In order to achieve the above object, a network port cover module according to one aspect of the present invention, includes: a plurality of modules inserted into and coupled to a network port of a network device, the plurality of modules being configured to be locked and coupled together or separated from each other, and configured to be locked and coupled to or unlocked and separated from the network port according to a locked and coupled state or an unlocked and separated state of the plurality of modules.

Hereby, a desired security can be ensured by blocking the network port easily.

Herein, the plurality of modules may include:
a locking module inserted into the network port, the locking module having a main-locking portion latched on a locking step of an inside of the network port, and a sub-locking portion interfered by entering of an unlocking tool from an outside; and a pattern module coupled to the locking module to be reciprocally movable, the pattern module having an interfering portion interfering with the main-locking portion when the pattern module moves, a locking step latched on the sub-locking portion and maintaining a locked state, and a keyhole provided by being recessed from a front surface of the pattern module to allow the unlocking tool to be inserted into the keyhole.

Hereby, there has a double locking structure in which the pattern module is unlocked from the locking module by using a previously authorized unlocking tool and allows the cover module to be separated from the network port.

Also, the plurality of modules may include a locking module and a pattern module that are configured to be locked and coupled together or unlocked and separated from each other, and to be coupled to the network port in a locked and coupled state, wherein the locking module includes a locking module body inserted into the network port, a main-locking portion that is provided to be elastically deformed at an outside of the locking module body and brought into contact with and latched on a locking step of the network port, an interfered portion connected to the main-locking portion, and a sub-locking portion provided to be elastically deformed at the locking module body, and the pattern module includes a front wall having a shape corresponding to an open front of the network port and a keyhole, a horizontal connecting portion horizontally extending from the front wall and having a pattern groove at a lower surface thereof to be connected to the keyhole, an interfering portion extending from the outside of the horizontal connecting portion and interfering with the interfered portion when the pattern module reciprocally moves relative to the locking module, thereby elastically deforming the main-locking portion, wherein when the locking module and the pattern module are coupled together, a locking groove provided at a lower surface of the horizontal connecting portion is latched on the sub-locking portion and the locking module and the pattern module are maintained in a locked and coupled state, and the sub-locking portion is interfered with and separated from the locking step by an unlocking tool inserted into the keyhole.

Hereby, a primary locked state between the locking module and the pattern module, and a secondary locked state between the locking module and the network port can be maintained to improve the security.

Also, the pattern module may further include an interfering wall protruding backward from the front wall and interfering with the main-locking portion of the locking module or a lower surface of the interfered portion by being brought into contact therewith, and separated from the main-locking portion or the interfered portion when the pattern module is unlocked from the locking module and moves.

Hereby, the locked state between the locking module and the pattern module can be maintained more firmly.

Also, the main-locking portion may be provided as a pair of main-locking portions that is provided symmetrically with an interposition of the interfered portion therebetween.

Hereby, the locking module is in contact and blocked at various points inside the network port, thereby being locked and coupled more firmly, and being prevented from a movement to improve the security.

Also, the locking module body may include: a pair of side walls inserted into the network port while being in close contact with opposite side walls of a main opening portion of the network port; a horizontal wall connected horizontally between the pair of side walls; and an upper wall extending on an upper portion of each of the side walls to face the horizontal wall while being spaced apart from the horizontal wall, wherein the horizontal connecting portion of the pattern module is coupled between the horizontal wall and the upper wall to be reciprocally slidable.

Hereby, it is thus easy to assemble the locking module with the pattern module such that relative movement of the locking module with the pattern module is possible, and the locking module can be more stably inserted into and coupled to the network port.

Further, the main-locking portion may include: a vertical extending portion extending upward from a rear end of the upper wall; and an elastic locking portion that is bent at the vertical extending portion and extends to face the horizontal wall while being spaced apart therefrom, and is latched on the locking step of the network port by being in contact therewith or separated from the locking step.

The sub-locking portion may be provided integrally at the horizontal wall by being incised, and arranged to be seated in the pattern groove provided at the lower surface of the horizontal connecting portion of the pattern module that is in contact with the horizontal wall.

Hereby, the main-locking portion and the sub-locking portion can perform independently a locking movement and provide a double locking structure of the cover module, thereby improving the security.

Also, the unlocking tool the unlocking tool may include, a body casing; and a pair of keys provided by protruding from a front end of the body casing, and configured to be closed to and opened from each other; and a handling portion provided on the body casing to operate the pair of keys to be closed to and opened from each other, wherein the unlocking tool is configured to release the locked state of the modules by inserting the keys into the keyhole provided in the cover module, and to relatively move the modules, thereby unlocking and separating the modules from the network port.

Hereby, the cover module is unlocked and separated from the network port by using an authorized unlocking tool, thereby further improving the security.

According to a network port cover module and a network port locking device having the cover module, when the cover module is inserted into the network port, the cover module is automatically locked and coupled to the network port, and the cover module is separated from the network port only by using an authorized unlocking tool.

Therefore, it is possible to prevent a data loss through the network port, an exposure of the network port, and an attempt to damage to the network port using various objects.

Also, the cover module is configured by a pair of modules, that is, the locking module and the pattern module, so that it is possible to lock and couple to and unlock and separate from each other. Hereby, the locked state between the locking module and the pattern module is maintained primarily, and the locked state between the locking module and the network port is maintained secondarily. Therefore, there is an advantage in that the security can be improved by maintaining a double locked state.

BRIEF DESCRIPTION OF THE DRAWINGS

The above and other objects, features and other advantages of the present invention will be more clearly understood from the following detailed description when taken in conjunction with the accompanying drawings, in which.

DETAILED DESCRIPTION OF THE INVENTION

Hereinbelow, a cover module for locking a network port and a device having the cover module according to an embodiment of the present invention will be described in detail with reference to the accompanying drawings.

Referring to FIGS. 1 to 13, the network port locking device 100 according to the embodiment of the present invention is configured to be inserted and combined to a network port 20 provided in a network device 10 such as an internet hub, a router, a data server, a PC, and an electronic device, and to lock the network port 20.

Figure 1:
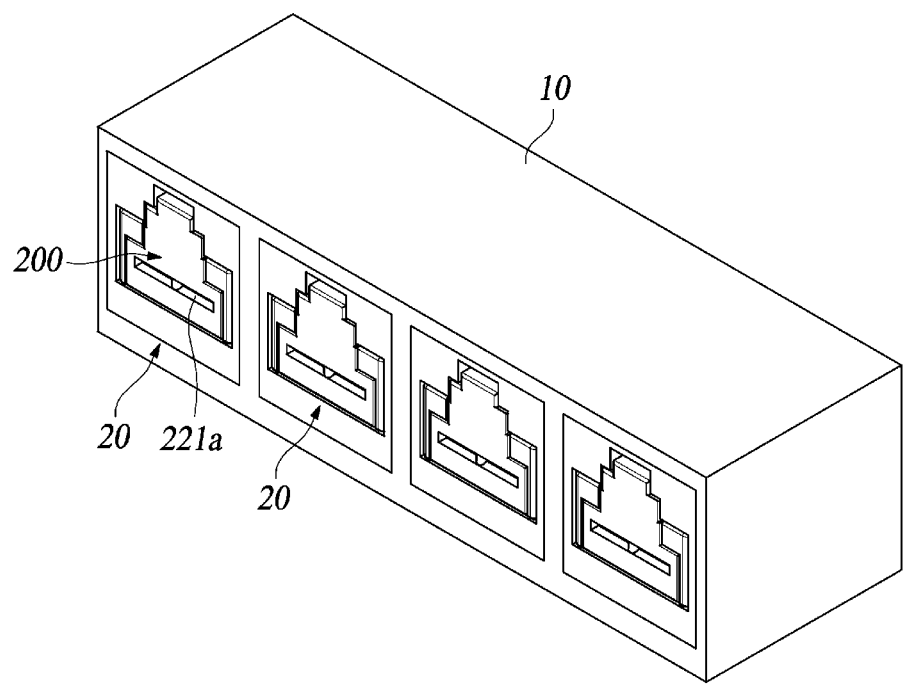
FIG. 1 is a perspective view that shows a locked state of a network port cover module according to an embodiment of the present invention to a network port of a network device.
Figure 2:
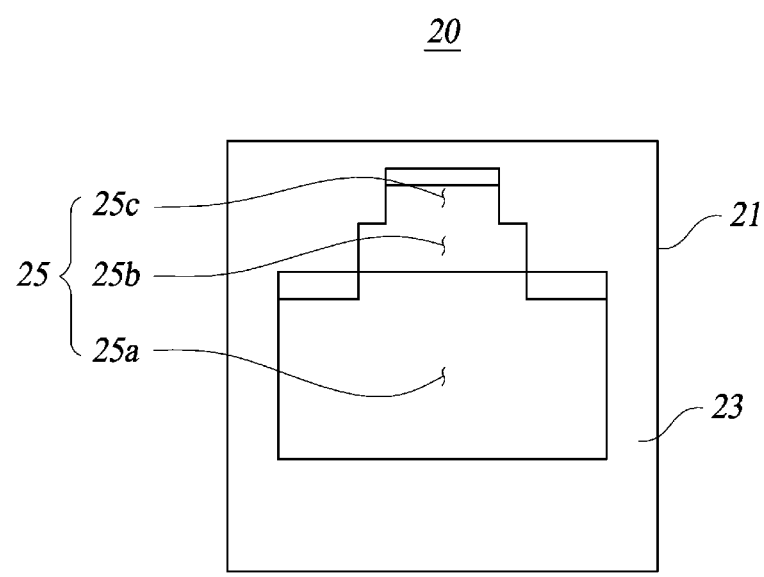
FIG. 2 is a front view of the network port of FIG. 1.
Figure 3:
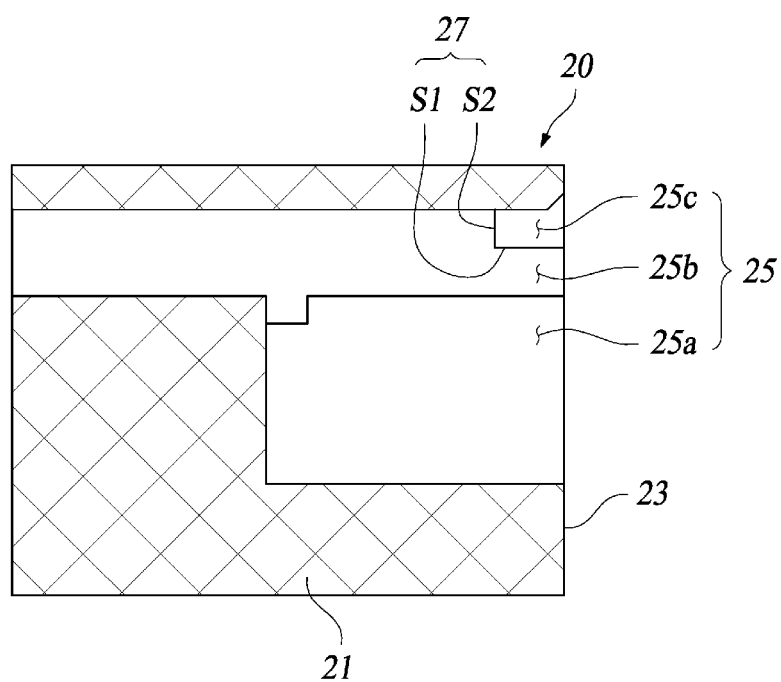
FIG. 3 is a sectional view of the network port of FIG. 1.

Referring to FIGS. 1 to 3, the network port 20 has a square-shaped port portion 25, which is recessed to a prescribed depth from an exposed surface 23 of a jack body 21 provided to be exposed to a side surface of the network device 10. The port portion 25 has a main opening portion 25*a* having a square plane shape, a first connection opening 25*b* extending at a long side of the main opening portion 25*a* and having a smaller width than a width of the long side of the main opening portion 25*a*, and a second connection opening portion 25*c* extending with a smaller width at the first connection opening portion 25*b*. At an inside of the main opening portion 25*a*, a data terminal (not shown) that is connected to the connector (not shown) and is capable of data communication is provided. And both side edges of the second connection opening portion 25c are provided to have a prescribed thickness from the exposed surface 23. Therefore, as shown in FIG. 3, a locking step 27 is provided by a stepped structure of an upper boundary surface S1 and an inner side wall S2 of the first connection opening portion 25b. Locking steps 27 are symmetrically provided on opposite sides of the second connection opening portion 25c as the center. The network port 20 of this configuration has a standardized size, a shape, and a structure.

The network port locking device 100 according to the embodiment of the present invention includes a cover module 200 inserted into and locked to the network port 20, and an unlocking tool 300 that unlocks and takes out the cover module 200 from the network port 20.

The cover module 200 includes a locking module 210, and a pattern module 220 that is combined with the locking module 210 to be moved relative to the locking module 210.

The locking module 210 includes a locking module body 211 inserted into the network port 20, a main locking portion 213 connected elastically and deformably to an upper portion of the locking module body 211, an interfered portion 215 connected to the main locking portion 213, and a sub-locking portion 217 provided on a lower surface of the locking module body 211.

The locking module body 211 has a pair of side walls 211a inserted closely into opposite side walls of the main opening portion 25a of the network port 20, a horizontal wall 211b horizontally connected between the pair of side walls 211a, and an upper wall 211c extending from an upper end of each of the side walls 211a and facing with the horizontal wall 211b while being spaced apart from the horizontal wall 211b. The pattern module 220 is slidably coupled between the horizontal wall 211b and the upper wall 211c. The sub-locking portion 217 is integrally connected to the horizontal wall 211b. A free end portion of the sub-locking portion 217 is provided to be inclined upwardly higher than the horizontal wall 211b, so as to interfere with a locking step 223b of the pattern module 220. Thus, it is possible to prevent relative movement of the pattern module 220 which is locked and combined with the locking module 210.

The main locking portion 213 is connected to a rear end of the upper wall 211c. Preferably, the pair of main locking portions is symmetrically provided by being connected to the rear end of the each upper wall 211c. The main locking portion 213 has a vertical extension 213a connected at the rear end of the upper wall 211c and extending upwardly, and an elastic locking portion 213b extending from the vertical extension 213a and facing the horizontal wall 211b while being spaced apart therefrom. An end portion of the elastic locking portion 213b is latched on the locking step 27 of the network port 20 while being in contact therewith, thereby undesired removing of the locking module 210 from the network port 20 is prevented.

The interfered portion 215 is provided so that the end portions of a pair of the elastic locking portions 213b are connected to each other. The interfered portion 215 is provided at the same height as a lower surface of the elastic locking portion 213b, and an upper surface of the interfered portion 215 is lower in height than an upper surface of the elastic locking portion 213b. An edge between the upper surface and a back surface of the interfered portion 215 is provided to be rounded so that an interfering portion 225 of the pattern module 220, which will be described later herein, may be in natural contact. In this elastic locking portion 213b, when the pattern module 220 moves in a direction of protruding and spacing apart from a front of the locking module 210 (an unlocking direction), the interfered portion 215 is pressed and elastically deformed by the interfering portion 225. Further, when it is elastically deformed, the locked state at the locking step 27 of the network port 20 may be unlocked.

The pattern module 220 has a front wall 221 having a shape corresponding to the open port portion 25 of the network port 20, a horizontal connecting portion 223 extending horizontally from the front wall 221, the interfering portion 225 extending upwardly from the horizontal connecting portion 223, and an interfering wall 227 protruding from a back of the front wall 221 and an upper surface of the horizontal connecting portion 223 and interfering in contact with a lower surface of the main locking portion 213.

The front wall 221 has a shape of corresponding to the port portion 25 of the network port 20. A keyhole 221a in which a key 320 of the unlocking tool 300 is inserted is provided through the front wall 221. The keyhole 221a is connected to a pattern groove 223a provided on a lower surface of the horizontal connecting portion 223. An inside wall of the pattern groove 223a has an engraved and embossed pattern corresponding to a key pattern of the key 320. Further, a stepped locking step 223b latched in contact with an end portion of the sub-locking portion 217 of the locking module 210 is provided at an end portion of the pattern groove 223a.

The horizontal connecting portion 223 extends to be connected behind the front wall 221, and is coupled to be capable of performing a reciprocal motion between the horizontal wall 211b and the upper wall 211c of the locking module body 211.

Figure 11:
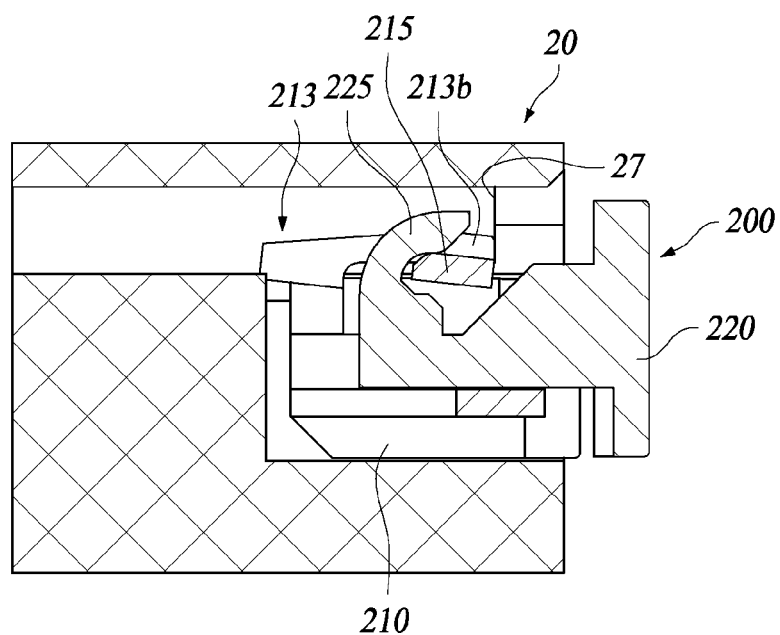
FIGS. 11 and 12 are sectional views that show the states of separation of a pattern module of the cover module inserted into the network port, from a locking module.

The interfering portion 225 roundly extends upward from a rear end of the horizontal connecting portion 223. The interfering portion 225 is arranged at a height corresponding to that of the interfered portion 215 of the locking module 210. Therefore, if the pattern module 220 is pulled out and unlocked by using the unlocking tool 300 in a fully coupled and locked state with the locking module 210, as shown in FIG. 11, the interfering portion 225 presses the interfered portion 215 in contact. Then, the elastic locking portion 213b is elastically deformed and separated from the locking step 27 of the network port 20.

Figure 9:
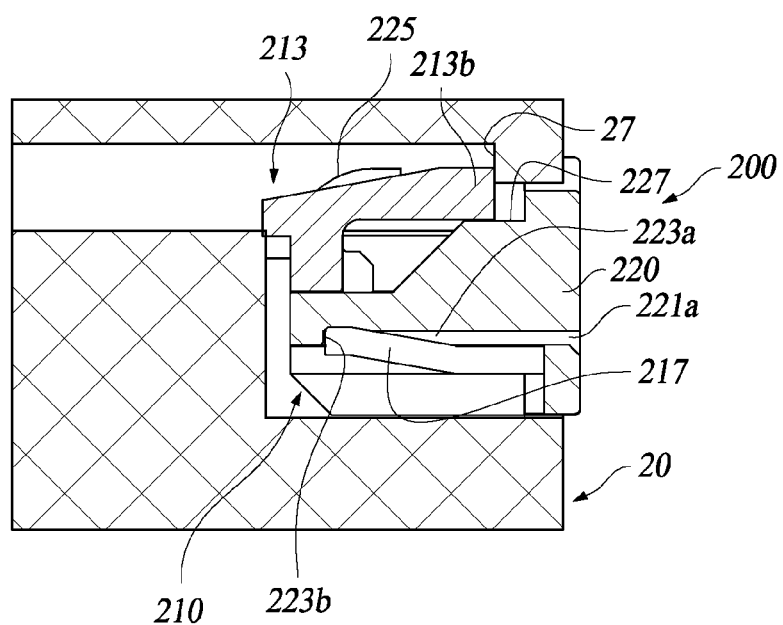
Figure 10:
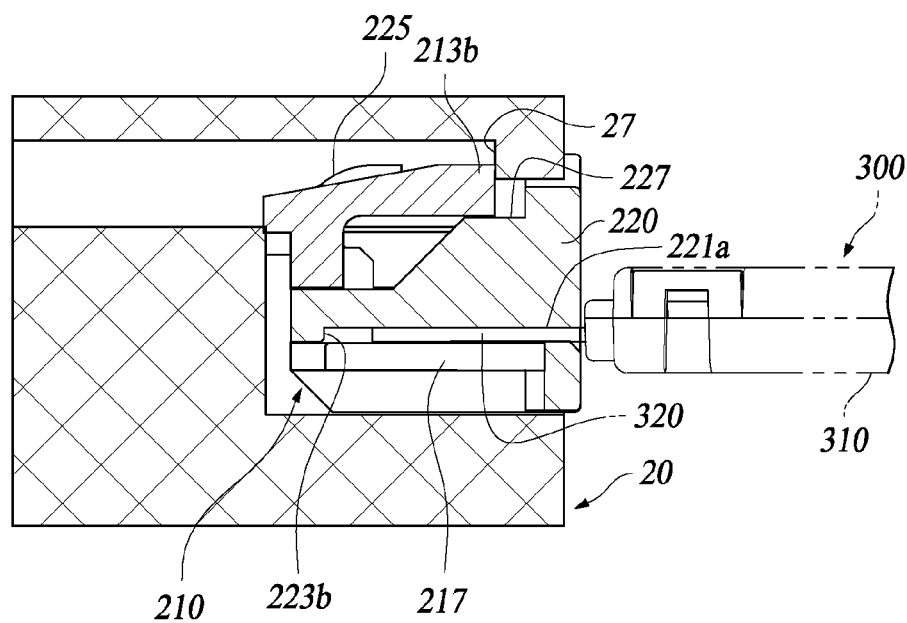
FIG. 10 is a sectional view that shows a state of FIG. 9 in which a key of an unlocking tool is inserted into a keyhole.
Figure 12:
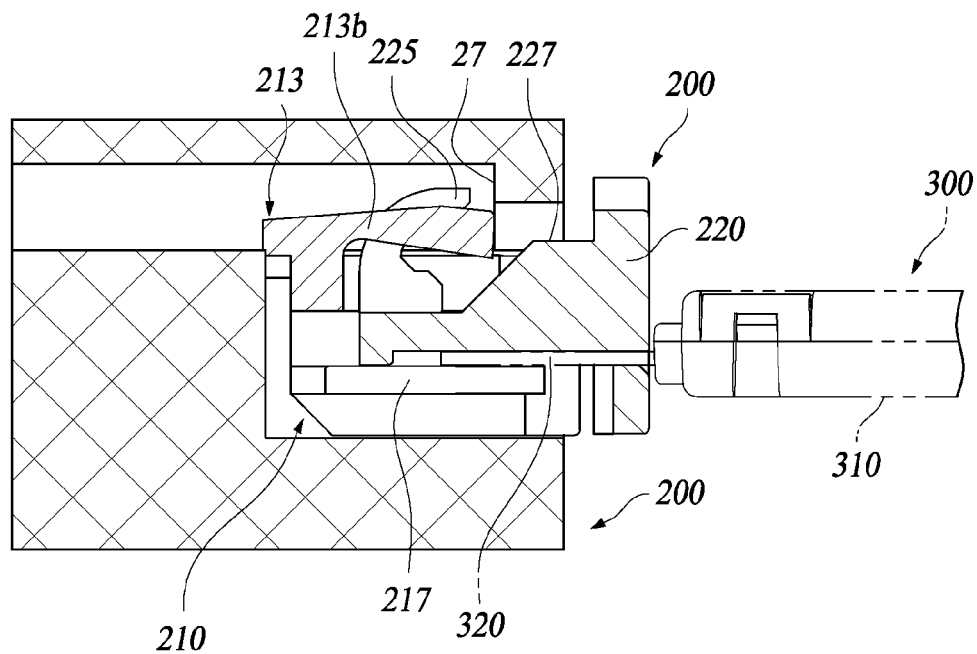
Figure 13:
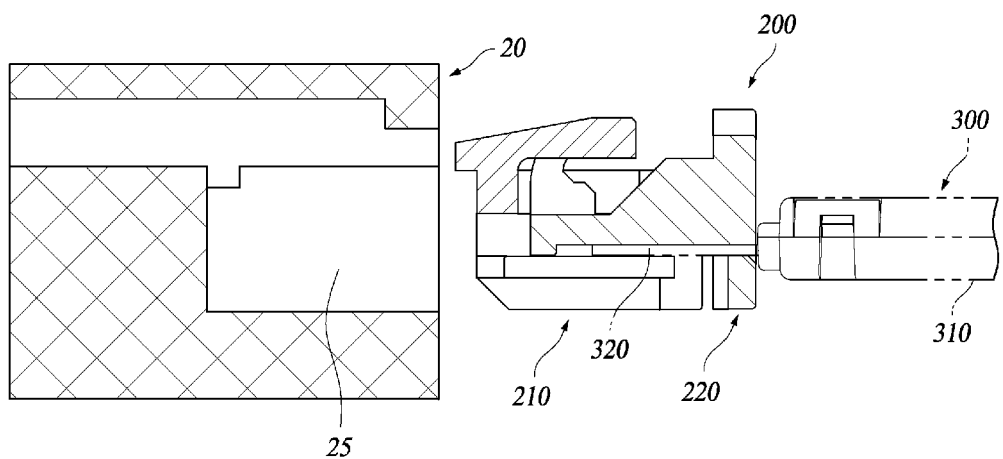
FIG. 13 is a sectional view that shows the state of completely extracting the cover module from the network port.

Meanwhile, the locking step 223b corresponds to a back side wall of the pattern groove 223a provided at the lower portion of the horizontal connecting portion 223, and is provided at a point where an end of the sub-locking portion 217 may be in contact. Therefore, as shown in FIG. 9, in a locked and coupled state of the pattern module 220 fully pushed to the locking module 210, the locking step 223b is latched on an end of the sub-locking portion 217, so that the pattern module 220 may not be moved to protrude forward from the locking module 210. Whereas, as shown in FIG. 9, when the key 320 of the unlocking tool 300 is inserted into the keyhole 221a, the sub-locking portion 217 located at the pattern groove 223a is interfered with and pushed by the key 320 while the key enters inside the pattern groove 223a. Then, the locking step 223b is separated from the sub-locking portion 217, as shown in FIG. 12, so the pattern module may be moved to protrude forward from the locking module 210.

Figure 8:
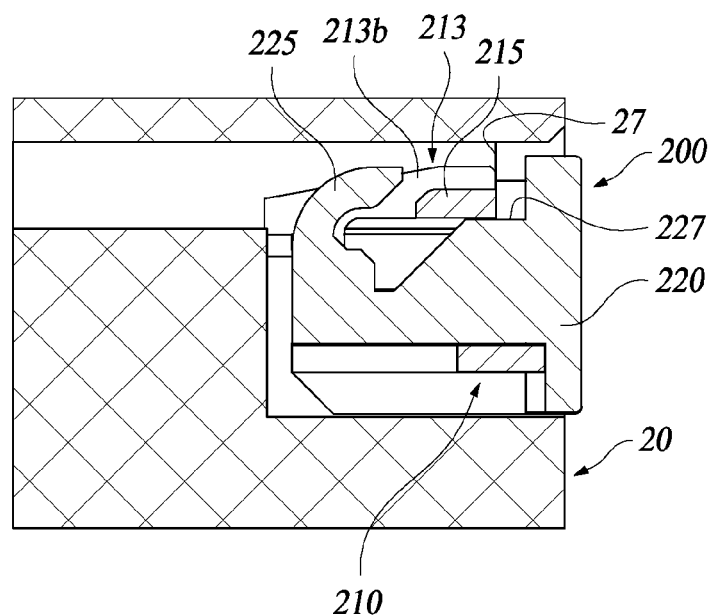
FIGS. 8 and 9 are sectional views that show a state of the cover module combined with a network port by inserting the cover module into the network port.

The interfering wall 227 is protruded toward an upper side of the horizontal connecting portion 223 and a back side of the front wall 221 and has a height at which the lower surface of the interfered portion may be in contact. Therefore, before the pattern module 220 is pulled out from the locking module 210 to a predetermined distance by using the unlocking tool 300, as shown in FIG. 8, the main locking portion 215 is maintained in a contact state with the interfering wall 227, so that an elastic deformation of the main locking portion 213 is prevented.

Figure 4:
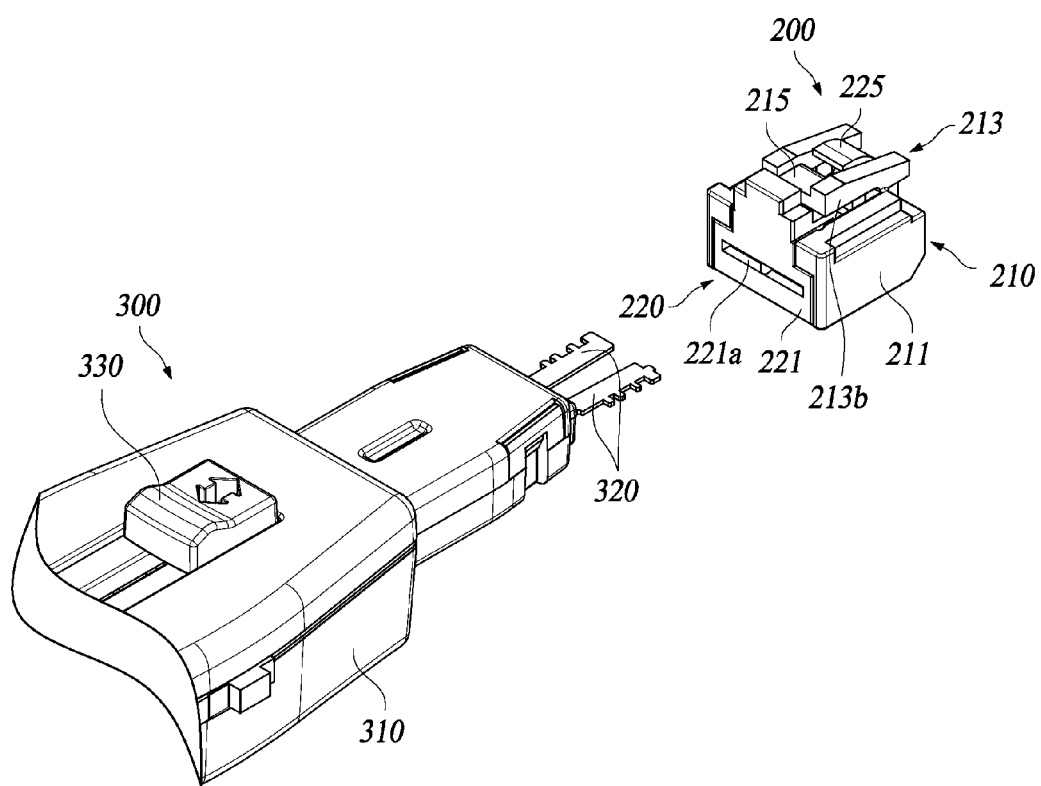
FIG. 4 is a perspective view that shows a network port locking device according to an embodiment of the present invention.
Figure 5:
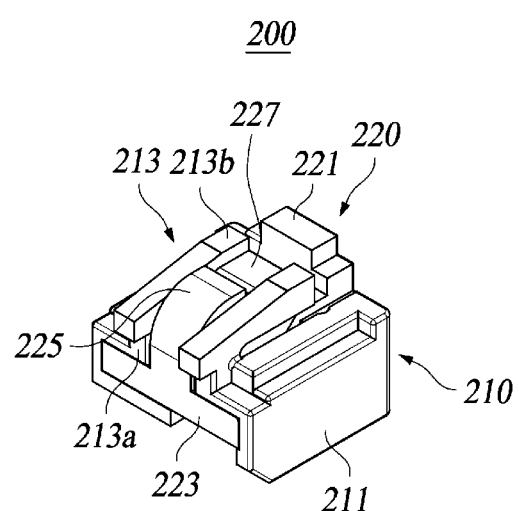
FIG. 5 is an enlarged perspective view of a cover module extracted of FIG. 4.
Figure 6:
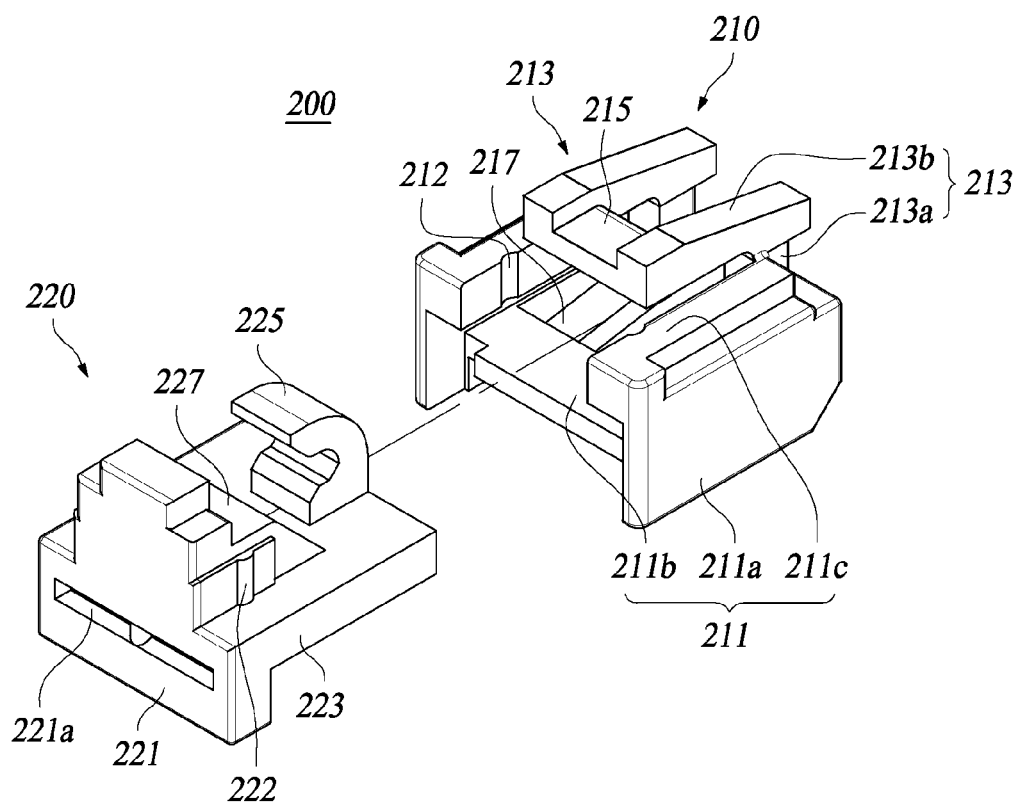
FIGS. 6 and 7 are exploded perspective views of the cover module of FIG. 5.
Figure 7:
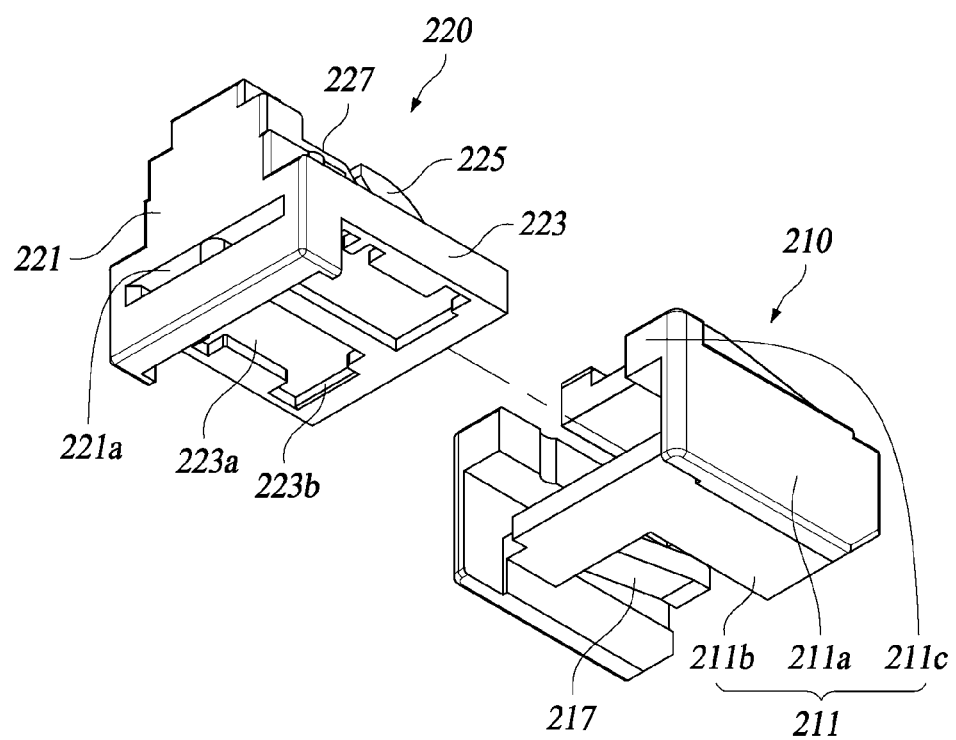

Furthermore, the locking module 210 and the pattern module 220 have respectively a locking groove 212 and a locking tongue 222 coupled together to be interlocked. The locking groove 212 and the locking tongue 222 may be located by switching their locations. As shown in FIG. 4, when the locking module 210 and the pattern module 220 are fully coupled and located in a locked state, the locking groove 212 and the locking tongue 222 are coupled to each other so that the two modules 210 and 220 maintain a coupled state without moving. The locking groove 212 is provided at an inside of the upper wall 211c, and the locking tongue 222 is provided to protrude at a side of the front wall 221.

The unlocking tool 300 has a body casing 310, a pair of keys 320 provided to protrude forward from the body casing 310, and a handling portion 330 for closing and opening the pair of keys 320. A predetermined key pattern which includes engraved and embossed patterns is provided on a side edge of each of the keys 320. The keys 320 are inserted into the keyhole 221a of the pattern module 220. Here, the pair of keys is opened by using the handling portion 330, and the key patterns of the keys 320 are inserted into the pattern groove 223a. The unlocking tool 300 may have various configurations. Further, the key pattern of the keys 320 and the pattern shape of the pattern groove 223a may be variously designed.

Figure 14:
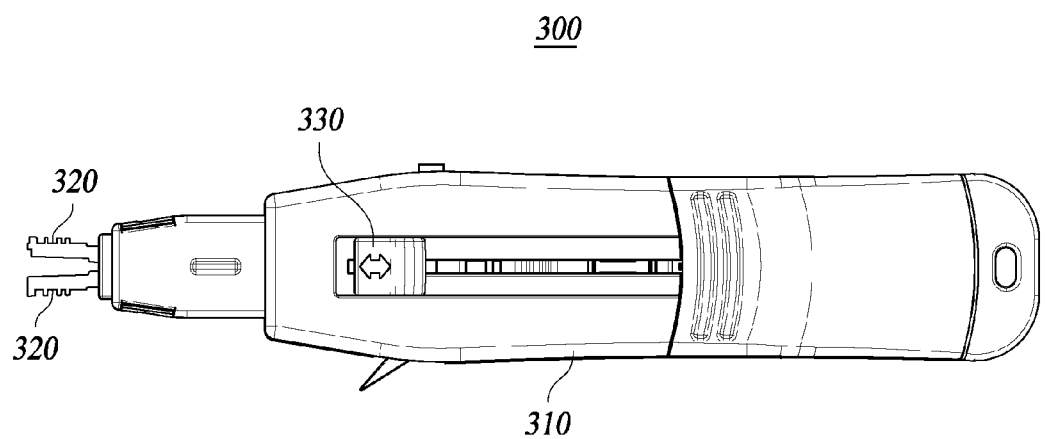
FIGS. 14 and 15 are plane views of an operational state of the key of the unlocking tool.
Figure 15:
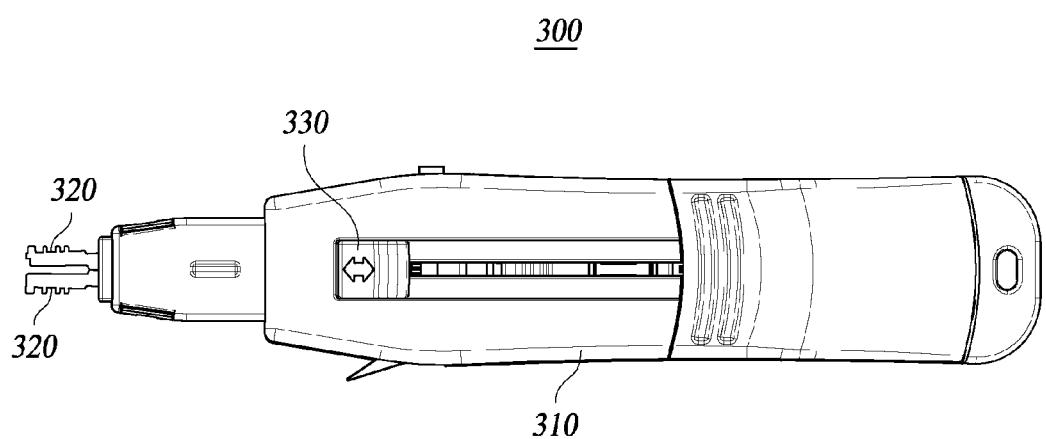

FIG. 15 shows a pair of keys 320 closed to each other. In this state, the keys are inserted into the keyhole. FIG. 14 shows the pair of keys 320 opened from each other, the keys are opened by using the handling portion 330 while being inserted into the keyhole 221a. The opened keys are coupled and interlocked with the pattern formed in the inside of the pattern groove 223a.

Hereinafter, an effect of the network port locking device 100 according to the embodiment of the present invention having the above-mentioned configuration will be described in detail.

As shown in FIG. 1, the cover module 200 is inserted into the network port 20 provided at the network device 10 to block the inside of the network port 20. Here, as shown in FIG. 8 and FIG. 9, the locking module 210 of the cover module 200 is maintained in a coupled state in which the pattern module 220 is fully pushed. Then, the main locking portion 213 is latched on the locking step 27 inside the network port 20, and the cover module 200 is locked without being removed from the network port 20. Further, the lower surfaces of the main locking portion 213 and the interfered portion 215 are supported so as not to be elastically deformed downward by being in contact with the interfering wall 227 of the pattern module 220.

Also, as shown in FIG. 9, the locking step 223b of the pattern module 220 is latched on the sub-locking portion 217 of the locking module 210 so as to maintain the locked state, so that the pattern module 220 is prevented from being protruded to the front of the locking module 210. Therefore, the pattern module 220 cannot move freely relative to the locking module 210, and the interfering portion 225 of the pattern module 220 is prevented from moving in an interfering direction relative to the interfered portion 215 of the locking module 210. Therefore, in this state, the network port 20 is effectively blocked by maintaining the locked and coupled state of the cover module 200 with the network port 20. As a result, data loss through the network port 20 and damage to the network port 20 which may be caused by child or an intruder putting a stick or an awl can be prevented.

On the other hand, the unlocking tool 300 may be used to remove the cover module 200 locked in the network port 20. More specifically, the keys 320 of the unlocking tool 300 are closed to each other as shown in FIG. 15, and inserted into the keyhole 221a. And then, the keys 320 entered into the inside of the pattern groove 223a through the keyhole 221a, interfere with the sub-locking portion 217 of the locking module 210 located in the pattern groove 223a and push the sub-locking portion 217 out of the pattern groove 223a. So, the locked state is released while the locking step 223b is separated from the sub-locking portion 217.

And the pair of keys 320 inserted into the keyhole 221a is opened from each other by the handling portion 330. Then, the opened keys 320 as shown in FIG. 14 are coupled with the pattern groove 223a in the keyhole 221a in which the patterns of the keys 320 and the pattern groove 223a are interlocked together. In this state, as shown in FIG. 12, the pattern module 220 is separated from the front of the locking module 210 by pulling the unlocking tool 300. The interfering wall 227 of the pattern module 220 is separated from the lower surface of the main-locking portion 213, and the interfering portion 225 pushes the interfered portion 215 so that the elastic locking portion 213b is separated from the locking step 27, thereby being unlocked.

Therefore, in the state of FIG. 12, when the unlocking tool is pulled more, the cover module is completely came out from the network port 20 and separated therefrom.

Like this, according to the network port locking device 100 according to an embodiment of the present invention, by inserting the cover module 200 into the network port 20, a locked state can be kept naturally and the network port 20 can be protected by blocking.

Also, the cover module 200 is, in accordance with a state of coupling the locking module 210 with the pattern module 220, can be locked or unlocked inside the network port 20. And by using the unlocking tool 300 having the key 320 configured to be coupled with the keyhole 221a of the pattern module 220, the cover module 200 can be separated from the network port 20. Therefore, the cover module 200 can be separated from the network port 20 only by using an authorized unlocking tool, and then, the security of the network port 20 is getting strengthened.

Although a preferred embodiment of the present invention has been described for illustrative purposes, those skilled in the art will appreciate that various modifications, additions and substitutions are possible, without departing from the scope and spirit of the invention as disclosed in the accompanying claims.

What is claimed is:

1. A network port cover module, comprising:
a plurality of modules inserted into and coupled to a network port of a network device, the plurality of modules configured to be locked and coupled together or separated from each other, and configured to be locked and coupled to or unlocked and separated from the network port according to a locked and coupled state or an unlocked and separated state of the plurality of modules, wherein the plurality of modules comprise a locking module inserted into the network port and a pattern module coupled to the locking module to be reciprocally movable,
wherein the locking module comprises:

a main-locking portion latched on a first locking step of an inside of the network port; and
a sub-locking portion interfered with by entering of an unlocking tool from an outside, and
wherein the pattern module comprises:
an interfering portion configured to elastically deform the main-locking portion of the locking module when the pattern module moves relative to the locking module;
a second locking step latched on the sub-locking portion and maintaining a locked state; and
a keyhole provided by being recessed from a front surface of the pattern module to allow the unlocking tool to be inserted into the keyhole.

2. The network port cover module of claim 1, wherein the locking module includes,
a locking module body inserted into the network port, the main-locking portion that is provided to be elastically deformed at an outside of the locking module body and brought into contact with and latched on the first locking step of the network port, an interfered portion connected to the main-locking portion, and the sub-locking portion provided to be elastically deformed at the locking module body,
wherein the pattern module includes,
a front wall having a shape corresponding to an open front of the network port and having the keyhole, a horizontal connecting portion horizontally extending from the front wall and having a pattern groove at a lower surface thereof to be connected to the keyhole, the interfering portion extending from an upper surface of the horizontal connecting portion and interfering with the interfered portion when the pattern module reciprocally moves relative to the locking module, thereby elastically deforming the main-locking portion,
wherein, when the locking module and the pattern module are coupled together, the second locking step provided at the lower surface of the horizontal connecting portion is latched on the sub-locking portion to allow the locking module and the pattern module to be maintained in a locked and coupled state, and
wherein the sub-locking portion is interfered with and separated from the second locking step of the pattern module by the unlocking tool inserted into the keyhole.

3. The network port cover module of claim 2, wherein the pattern module further includes:
an interfering wall protruding backward from the front wall and interfering with the main-locking portion of the locking module or a lower surface of the interfered portion by being brought into contact therewith, and separated from the main-locking portion or the interfered portion when the pattern module is unlocked from the locking module and moves.

4. The network port cover module of claim 2, wherein the main-locking portion is provided as a pair of main-locking portions that is provided symmetrically with an interposition of the interfered portion therebetween.

5. The network port cover module of claim 2, wherein the locking module body includes:
a pair of side walls inserted into the network port while being in close contact with opposite side walls of a main opening portion of the network port;
a horizontal wall connected horizontally between the pair of side walls; and
an upper wall extending on an upper portion of each of the side walls to face the horizontal wall while being spaced apart from the horizontal wall, wherein the horizontal connecting portion of the pattern module is coupled between the horizontal wall and the upper wall to be reciprocally slidable.

6. The network port cover module of claim 5, wherein the main-locking portion includes:
a vertical extending portion extending upward from a rear end of the upper wall; and
an elastic locking portion that is bent at the vertical extending portion and extends to face the horizontal wall while being spaced apart therefrom, and is latched on the first locking step of the network port by being in contact therewith or separated from the first locking step.

7. The network port cover module of claim 5, wherein the sub-locking portion is provided integrally at the horizontal wall by being incised, and arranged to be seated in the pattern groove provided at the lower surface of the horizontal connecting portion of the pattern module that is in contact with the horizontal wall.

8. A network port locking device, comprising:
a network port cover module of any one of the preceding claims; and
the unlocking tool that unlocks and separates the plurality of modules in the locked state of the cover module to the network port so that the cover module is unlocked to be separated from the network port.

9. The network port locking device of claim 8, wherein the unlocking tool includes,
a body casing; and
a pair of keys provided by protruding from a front end of the body casing, and configured to be closed to and opened from each other; and
a handling portion provided on the body casing to operate the pair of keys to be closed to and opened from each other, wherein
the unlocking tool is configured to release the locked state of the modules by inserting the keys into the keyhole provided in the cover module, and to relatively move the modules, thereby unlocking and separating the modules from the network port.

10. A network port cover module comprising a locking module and a pattern module that are configured to be locked and coupled together or unlocked and separated from each other, and configured to be locked and coupled to or unlocked and separated from a network port of a network device,
wherein the locking module comprises:
a locking module body inserted into the network port;
a main-locking portion that is provided to be elastically deformed at an outside of the locking module body and brought into contact with and latched on a first locking step of the network port;
an interfered portion connected to the main-locking portion; and
a sub-locking portion provided to be elastically deformed at the locking module body,
wherein the pattern module comprises:
a front wall having a shape corresponding to an open front of the network port and having a keyhole;
a horizontal connecting portion horizontally extending from the front wall and having a pattern groove at a lower surface thereof to be connected to the keyhole;
an interfering portion extending from an upper surface of the horizontal connecting portion and interfering with the interfered portion when the pattern module reciprocally moves relative to the locking module, thereby elastically deforming the main-locking portion, wherein, when the locking module and the pattern module are coupled together, a second locking step provided at the lower surface of the horizontal connecting portion is latched on the sub-locking portion to allow the locking module and the pattern module to be maintained in a locked and coupled state, and wherein the sub-locking portion is interfered with and separated from the second locking step of the pattern module by an unlocking tool inserted into the keyhole.

\* \* \* \* \*